METHOD OF MANUFACTURING HETERO-JUNCTION ELEMENTS

Filed Dec. 27, 1962

INVENTOR.
JYOJI ODA
BY
OSTROLENK, FABER, GERB & SOFFEN
ATTORNEYS 3,264,148
METHOD OF MANUFACTURING HETERO-JUNCTION ELEMENTS

Jyoji Oda, Tokyo, Japan, assignor to Nippon Electric Company Limited, Tokyo, Japan, a corporation of Japan
Filed Dec. 27, 1962, Ser. No. 247,693
Claims priority, application Japan, Dec. 28, 1961, 36/47,950
5 Claims. (Cl. 148—177)

Figure 1:
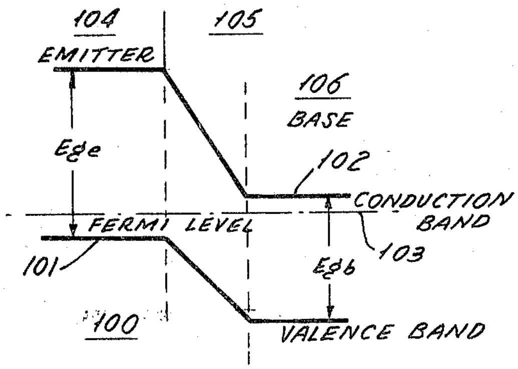

The instant invention relates to semi-conductor and transistor devices and more particularly to a novel method for producing both semi-conductor and transistor devices containing high quality hetero-junctions.

Solid state semi-conductor and transistor devices presently in use are found to have p-n junctions wherein the energy gap level is substantially constant across the p-n junction. While such prior art devices are in widespread use in all forms of electrical circuitry it has been found to be advantageous to develop a hetero-junction semi-conductor or transistor device characterised by the fact that the energy gap from the valence band to the conduction band of the device constantly changes across the junction of the p-n material. Such hetero-junction semi-conductors have been found to have substantially different electrical and physical characteristics from those of prior art semi-conductor devices, many of these characteristics having been pointed out in articles by H. Kroemer, such as for example the article entitled "Quasi-Electric and Quasi-Magnetic Fields in Non-Uniform Semi-Conductors" appearing in volume 18 of the RCA Review No. 3, page 332, published in 1957. The above mentioned hetero-junction characteristics have been found to exist not only in p-n junction devices but have also been discovered in electrical conductive elements of a single semi-conducting material which has been joined with a material of similar conduction type such as for example a p-p junction. Hetero-junction devices of the type mentioned above have been found to have advantageous uses in various applications. As one example, a hetero-junction semi-conductor having a wide energy gap at one end thereof, has been employed as an emitter electrode, while the opposite end which is characterized with a substantially narrower energy gap has been employed as a base electrode. In such an arrangement the hetero-junction semi-conductor device exhibits the merits of substantially high emitter efficiency and substantially small emitter-barrier capacity.

In hetero-junction drift transistor devices wherein the energy gap across the entire base region of the transistor device has been varied linearly it is possible to obtain an extremely intensive electric field in the base region and even though the current density through the base region be increased, it has been shown the electric field intensity will not decrease due to the increase in current density. While semi-conductor devices having such advantageous characteristics would have many uses in circuitry applications, up to the present time it has been extremely difficult to produce or manufacture such hetero-junction devices. While attempts have been made to produce such devices, at present the only successes which have been achieved have been those in producing such a hetero-junction between the elements germanium and silicon and the element germanium which is joined with gallium-arsenide (GaAs). In the former example, the hetero-junction was developed by the alloying technique, while in the latter, the hetero-junction was developed by use of the vapor growth process.

The instant invention provides a method for producing such hetero-junction semi-conductor devices which employ germanium or silicon single crystals in conjunction with Group III–V compounds, by use of a novel process. By Group III–V compounds what is meant is the compound employed in producing the hetero-junction semi-conductor is comprised of a metallic element taken from Group III of the Periodic Arrangement of Elements which is joined in the compound with a non-metallic element taken from Group V of the Periodic Arrangement of Elements, wherein the Periodic Arrangement of Elements referred to is that appearing on pages 388 and 389 of the Handbook of Chemistry and Physics, 35th edition, copyright 1953, by the Chemical Rubber Publishing Company of Cleveland, Ohio. Typical metallic elements taken from Group III of the Periodic Arrangement of the Elements are aluminum, gallium and indium, and typical non-metallic elements employed in the compound taken from Group V of the Periodic Arrangement of the Elements are phosphorus, arsenic, and antimony.

The method of the instant invention is comprised of the steps of alloying an element taken from Group III of the Periodic Chart to a silicon or germanium wafer; etching the alloyed composition and combining the silicon and Group III alloy composition with an element taken from Group V of the Periodic Chart by the employment of a vapor phase reaction growth process. The vapor phase reaction growth process is carried out in a medium of an insert gas which is immersed in a suitable oven or furnace having a first temperature zone in which the alloy composition is positioned and a second temperature zone in which the Group V element is positioned. The resulting alloy composition is slowly cooled over a predetermined time period. The above process provides an indium arsenide composition which makes contact with the silicon wafer. A certain percentage according to atomic weight of the silicon is found in the indium layer after the alloying process causing the vapor grown indium arsenide to exhibit n-type characteristics. Since the silicon wafer is a p-type element, this results in the development of a hetero p-n junction. Hetero-junction semi-conductors developed in accordance with the above described process have been found to have very little ill effect upon the crystal lattice of the junction portion thereby providing the junction portion having current-voltage characteristics which are extremely close to theoretical calculations and which find extremely advantageous use in many circuit applications.

It is therefore one object of the instant invention to provide a novel method for the manufacture of hetero-junction semi-conductor devices.

Another object of the instant invention is to provide a novel method for forming hetero-junction semiconductor devices employing the steps of alloying and vapor phase reacting to produce the hetero-junction.

Still another object of the instant invention is to provide a method for forming hetero-junction semi-conductor devices comprising the steps of alloying a metallic element from Group III of the Periodic Chart with a silicon or germanium wafer and combining the alloyed composition with the non-metallic element taken from Group V of the Periodic Chart by means of a vapor process.

Another object of the instant invention is to provide a method for forming hetero-junction semi-conductor devices which is comprised of the steps of combining a metallic element taken from Group III of the Periodic Chart with a silicon or germanium wafer by means of a vapor process and combining the alloyed composition with an element taken from Group V of the Periodic Chart.

Figure 2:
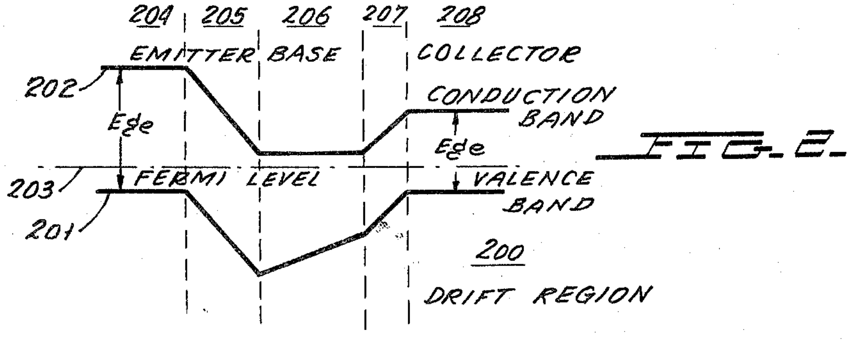

These as well as other objects of the instant invention will become apparent after reading the accompanying description of the drawings in which:

FIGURES 1 and 2 show an energy gap plot for a hetero-junction semi-conductor designed in accordance with the principles of the instant invention.

Figure 3A:
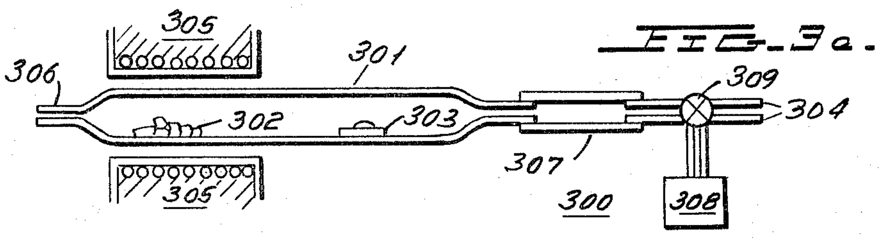
Figure 3B:
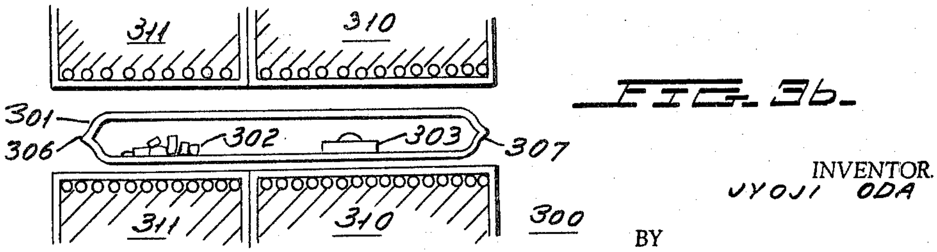

FIGURES 3*a* and 3*b* are cross-sectional views of the device employed in the manufacture of hetero-junction elements in accordance with the principles of the instant invention.

Figure 4:
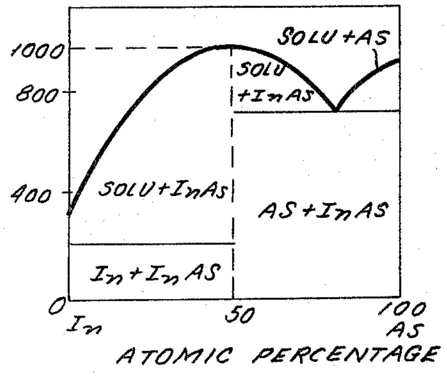

FIGURE 4 is a plot showing the phase diagram of gallium-arsenide.

Prior art operations and devices with which the present application is concerned, are described, for instance in the prior art publications listed below:

(1) H. Kroemer: "Quasi-electric and quasi-magnetic fields in non-uniform semiconductors." R.C.A. Rev., Vol. XVIII, No. 3, p. 332, 1957.
(2) H. Kroemer: "Theory of a wide-gap emitter for transistors." Proc. IRE, Vol. 45, No. 11, p. 1535, 1957.
(3) H. L. Armstrong: "On junctions between semiconductors having different energy gaps." Proc. IRE, Vol. 46, No. 6, p. 1307, 1958.
(4) J. C. Marinace: "Tunnel diodes by vapor growth of Ge on Ge and GaAs." IBM Jr., Res. Dev., Vol. 4, No. 3, p. 280, 1960.
(5) R. L. Anderson: "Germanium-gallium arsenide hetero-junctions." IBM Jr., Res. Dev., Vol. 4, No. 3, p. 283, 1960.
(6) K. T. Laksman: "PN Junctions between semiconductors having different energy gaps." Proc. IRE, Vol. 48, No. 9, p. 1646, 1960.
(7) A. F. Gibson Ed: "Progress in semiconductors, Vol. 2" Heywood & Co. Ltd., p. 1, 1957.

To simplify the description of the present invention, it is assumed that all operations and operating elements of such known systems are to be considered part of the present disclosure, except for the modifications and features of the present invention as hereinafter described.

Referring now to the drawings, FIGURE 1 shows an energy gap plot 100 for a hetero-junction semi-conductor device where curve 101 represents the valence band, curve 102 represents the conduction band and curve 103 represents the Fermi level. In the emitter region 104 the energy gap between the valence band 101 and the conduction band 102 represented by energy $E_{ge}$ is substantially large. In the base region 106 the energy gap between valence band 101 and conduction band 102 is represented by the energy $E_{gb}$ and is substantially smaller than the energy gap $E_{ge}$. Region 105 represents the junction between the emitter region 104 and base region 106 and it can be seen that the left-hand edge of the junction region has a substantially larger energy gap ($E_{ge}$) while the right-hand edge of the junction region 105 has a substantially smaller energy gap ($E_{gb}$) and further that the energy gap diminishes in a continuous manner in crossing the junction 105 from the emitter region 104 from the base region 106.

The energy gap plot 200 of FIGURE 2 is comprised of the valence band curve 201, the conduction band curve 202 and a Fermi-level curve 203. In the emitter region 204 of plot 200 the energy gap $E_{ge}$ is substantially large while in the collector region 208 the energy gap $E_{gc}$ is substantially smaller than the energy gap of emitter region 204. In the base region 206 of plot 200 it can be seen that the energy gap varies continuously across the region, diminishing in magnitude in moving from the left-hand to the right-hand end of the base region 206. In the junction region 207 between base region 206 and collector region 208 it can be seen that the energy gap across the junction varies continuously such that it diminishes in magnitude in moving through the junction region 207 from the left to the right. In base region 206 it can be seen that the energy gap varies continuously such that it decreases in moving through the junction region 205 from the left to the right.

One preferred method of manufacturing a hetero-junction semi-conductor of silicon and indium arsenide (InAs) is as follows: (it being understood that the method given below is merely exemplary):

Initially a p-type silicon wafer of a fixed size is measured to determine its weight. The p-type silicon wafer is then placed in an alloying furnace (not shown) and an indium pellet or grain is placed upon the silicon wafer. The alloying furnace is operated at a suitable temperature which is approximately 1000° centigrade. A mixture of argon and hydrogen is used as the ambient gas present in the alloying furnace. It should be understood that, if necessary, a vacuum evaporation process may be used as an alternative for the alloying process.

Continuing, however, the alloy furnace is then slowly cooled after the alloying process. The silicon wafer is then removed from the alloying furnace after the furnace has been suitably cooled and is then etched for several seconds by means of an etching solution of nitric acid and hydrogen fluoride, in order to remove any oxide films on the surface of the indium and to further remove any incomplete indium alloyed portion around the circumference of the alloyed surface. The alloyed composition of indium and silicon is then allowed to dry. After completion of the drying process, it is then necessary to determine the amount of indium contained in the indium silicon alloy which is done by weighing the alloy and subtracting the recorded weight of the silicon wafer, which was weighed prior to the alloying process, from the weight of the indium silicon alloy. In order to provide a more accurate weight indication, it is further necessary to determine what amount of silicon was removed during the etching process. This can be done by taking a silicon wafer of substantially the identical weight of the alloyed silicon wafer and subjecting it to the etching process for a time period equal in length to the time period in which the etching process of the silicon indium alloyed was performed. The etched silicon wafer is then weighed. This recorded weight is subtracted from the weight of the silicon wafer prior to the etching process. The difference therebetween is then subtracted from the recorded weight for the etched silicon indium alloy in order to obtain an extremely accurate indication of the amount of indium contained in the indium silicon alloy.

The indium silicon alloy 303 is then placed in quartz tube 301 contained in the process set-up 300 shown in FIGURE 3*a*. A measured amount of arsenic 302 is then placed in quartz tube 301 in the position shown in FIGURE 3*a*. The amount of arsenic placed in quartz tube 301 is just a little bit more than the amount of the indium contained in the alloy composition 303, such that the relative atomic weights of the arsenic 302 and the indium of the alloyed composition 303 are substantially 50% and 50% relative to one another. Any arsenic oxide present in quartz tube 301 is removed by heating quartz tube 301 in a furnace 305 for approximately two hours at a temperature of 300° C. During the heating process argon gas (not shown) is introduced which gas communicates with quartz tube 301 by means of a valve member 309 which is suitably opened to permit the ingress of argon gas into quartz tube 301. After completion of the heating process to remove arsenic oxide, furnace 305 and hence quartz tube 301 is then cooled and end 306 of quartz tube is sealed in any suitable manner.

The quartz tube 301 is then evacuated by a vacuum pump 308 communicating with quartz tube 301 through valve 309. The evacuation process is continued until approximately 5 mm. Hg argon gas remains within quartz tube 301. At this time valve 309 is then closed in order to maintain the desired vacuum contained within tube 301. Quartz tube 301 is then sealed at its opposite end 307 and is then positioned in a two zone furnace arrangement as shown in FIGURE 3*b* which is comprised of first and second furnaces 311 and 310, respectively. It should be noted that the arsenic 302 is positioned in the region of furnace 311, while the alloy composition 303 is positioned in the region of furnace 310. Furnace 311 is then heated to a temperature of 600° C. (arsenic vapor pressure is above 0.9 atmospheric pressure) while furnace 310 is heated to a temperature of 1000° C.

Thus by heating the indium under approximately one atmospheric pressure of arsenide vapor pressure this results in the production of indium arsenide as can be understood from the plot of FIGURE 4. The temperatures of furnaces 311 and 310 are kept in a state of equilibrium for a period of approximately three hours and then cooled slowly at a temperature gradient of the order of 0.5° C. per minute. The temperature gradients for each furnace 311 and 310 is so selected that the temperature level of the indium arsenide side becomes higher that the temperature level of the silicon wafer side. Thus, after cooling and upon complete solidification there is obtained indium arsenide in surface contact with silicon. As approximately 5%, in atomic percentage, of silicon is contained in the indium layer after the alloyed process the indium arsenide developed after the vaporization reaction thereby contains silicon. As silicon acts as a donor in the indium arsenide this thereby provides a grown indium arsenide material which exhibits n-type characteristics. Since the silicon wafer itself is a p-type material the final product is thereby a hetero-junction p-n semi-conductor.

If it is desired to obtain a hetero-junction p-p material, this is done by adding either zinc or cadmium to the indium prior to the alloying process. The remainder of the method is then substantially identical to the method described above for providing a hetero-p-n junction with one exception being that of carrying out both the alloying and the vaporization reaction processes consecutively as described previously by first sealing the quartz tube from the very beginning of the process and without separating the alloying and vapor reactioning process.

With respect to germanium, as the melting point of germanium (958° C.) is near the reaction temperature of indium arsenide (940° C.), it is found that the above described process does not give as favorable results when employing germanium in place of the silicon. In order to overcome these disadvantages the reaction temperature of indium arsenide is set in the range of 500° C. to 600° C. It is difficult to combine the entire amount of indium with indium arsenide in order to effect reaction in the neighborhood of 95% indium as can best be seen from the indium arsenide phase diagram of FIGURE 4. Consequently, there still remains some indium which has not been reacted with, but by cooling the germanium wafer from the bottom it is still possible to obtain a hetero-junction of germanium-indium arsenide.

Although the descriptions given above have been with reference to manufacturing hetero-junctions of germanium or silicon with indium arsenide for a hetero p-n junction and for a hetero-junction of germanium or silicon or zinc, it should further be understood that the present invention is not limited to the above methods but is also applicable to substantially all of the III–V group compound semi-conductors. For example, the above methods work equally well when using the III–V compounds of aluminum phosphide (AlP), gallium phosphide (GaP), indium arsenide (InAs), gallium arsenide (GaAs), aluminum antimonide (AlSb), gallium antimonide (GaSb) and indium antimoide (InSb), in employing any of the above III–V group compounds the aluminum, gallium or indium is alloyed with germanium or silicon and then acted upon by the phosphor, antimony or arsenic in accordance with the above described examples.

The above described methods have been found to produce hetero-junction devices which have substantially no effect upon the crystal lattice of the p-n or p-p junction, thus providing en extremely high quality junction portion. Such hetero-junction devices produced in accordance with the above methods have excellent current-voltage characteristics which very closely approximate theoretical values, thereby providing semi-conductor devices having the unique hetero-junction characteristics described previously. It should be further noted that in addition to the above mentioned group compounds employed in producing hetero-junction devices it is also possible to employ the above methods in the production of semi-conductors which contain volatile element compounds which are combined with germanium, silicon and so forth.

Although there has been described a preferred embodiment of this novel invention, many variations and modifications will now be apparent to those skilled in the art. Therefore, this invention is to be limited, not by the specific disclosure herein, but only by the appended claims.

The embodiments of the invention in which an exclusive privilege or property is claimed are defined as follows:

1. A method for the manufacture of a hetero-junction semiconductor device, which comprises
(a) alloying a Group III element selected from the group consisting of indium, gallium and aluminum with a doped semiconductor wafer constituted of a material selected from the group consisting of silicon and germanium;
(b) heating of the resulting alloy in the presence of the vapor of a Group V element selected from the group consisting of phosphorus, arsenic, and antimony, said vapor being maintained at a pressure of approximately 1 atmosphere; and
(c) slow cooling the resulting alloy composition to produce a product having a first semiconductive region constituted of an intermetallic compound of one of said Group III and of said Group V elements and a second semiconductive region constituted of said doped semiconductor wafer, said regions defining a heterojunction therebetween.

2. The method for the manufacture of a hetero-junction semiconductor device as defined in claim 1, in which the alloy formed in step (a) is produced by heating said Group III element and said semiconductor wafer in abutting relation in the presence of an inert atmosphere at a temperature above the melting point of said Group III element, and in which the alloyed wafer is thereafter etched to remove oxide deposits and incompletely alloyed portions from the surface of the Group III element constituent of the alloy composition.

3. The method for the manufacture of a hetero-junction semiconductor device as defined in claim 1, in which the alloy heated in step (b) is maintained within a first zone at a first temperature and the Group V element alloyed therewith is maintained within a second zone at a second temperature to maintain said Group V element at a pressure of substantially 1 atmosphere, said first and second zones communicating with one another in order that the vapor of the Group V element formed in said second zone diffuses into said first zone, alloying with the Group III element of said alloy and forming said intermetallic compound.

4. A method for the manufacture of a hetero-junction semiconductor device, which comprises
(a) alloying an indium particle with a doped silicon semiconductor wafer;
(b) cooling the resulting alloy and etching the same to remove oxide particles and incompletely alloyed indium portions from adjacent the indium-silicon alloyed surface;

(c) heating the resulting alloy in the presence of arsenic vapor; and (d) slow cooling the resulting alloy composition to produce a product having a first semiconductive region constituted of indium-arsenide and a second semiconductive region constituted of said doped silicon semiconductor wafer, said regions defining a heterojunction therebetween.

5. The method for the manufacture of a heterojunction semiconductor device, as defined in claim 4, in which the indium-silicon alloyed composition is heated in step (c) within a first region maintained at a temperature of about 1000° C. and in which arsenic is heated within a second region communicating with said first region and maintained at a temperature of about 600° C., to thereby diffuse arsenic vapor at about 1 atmosphere pressure into said first region to effect the production of said indium-arsenide intermetallic compound.

References Cited by the Examiner

UNITED STATES PATENTS

| | | | |
|---|---|---|---|
| 2,909,543 | 10/1959 | Losco et al. | 148—180 |
| 2,929,859 | 3/1960 | Loferski | 148—191 |
| 3,057,762 | 10/1962 | Gans | 148—189 |
| 3,093,517 | 6/1963 | Lyons | 148—33 |

OTHER REFERENCES

Silvey: IBM Technical Disclosure Bulletin, vol. 4, No. 7, page 62, December 1961.

HYLAND BIZOT, *Primary Examiner.*

BENJAMIN HENKIN, DAVID L. RECK, *Examiners.*

R. O. DEAN, *Assistant Examiner.*